United States Patent

Kadomura

Patent Number: 5,310,456
Date of Patent: May 10, 1994

[54] DRY ETCHING METHOD

[75] Inventor: Shingo Kadomura, Kanagawa, Japan

[73] Assignee: Sony Corporation, Tokyo, Japan

[21] Appl. No.: 736,947

[22] Filed: Jul. 29, 1991

[30] Foreign Application Priority Data

Jul. 30, 1990 [JP] Japan .................. 2-199249

[51] Int. Cl.$^5$ .......................... H01L 21/00
[52] U.S. Cl. .................. 156/657; 156/643; 156/646; 156/662; 156/664; 156/656; 156/665
[58] Field of Search ............... 156/643, 646, 662, 664, 156/665, 656, 657

[56] References Cited

U.S. PATENT DOCUMENTS

| | | | |
|---|---|---|---|
| 4,462,863 | 7/1984 | Nishimatsu et al. | 156/646 |
| 4,473,436 | 9/1984 | Beinvogl | 156/656 |
| 4,592,800 | 6/1986 | Landau et al. | 156/646 |
| 4,711,698 | 12/1987 | Douglas | 156/643 |
| 4,943,344 | 7/1990 | Tachi et al. | 156/662 |
| 4,956,043 | 9/1990 | Kanetomoto et al. | 204/298.34 |
| 4,983,543 | 1/1991 | Sato et al. | 437/192 |
| 5,147,500 | 9/1992 | Tachi et al. | 156/643 |

FOREIGN PATENT DOCUMENTS

| | | |
|---|---|---|
| 60-037821 | 9/1986 | Japan . |
| 63-181430 | 7/1988 | Japan . |
| 1284420 | 11/1990 | Japan . |
| 8309631 | 12/1990 | Japan . |

OTHER PUBLICATIONS

"Disulfur dibromide, disulfur dichloride, and disulfur difluoride:halogen compounds for low pressure plasma etching"; Ons et al.; 76-11; Electric Phenomena; 1989; abstract.

"Plasma Etching of Siticon by Sulfur hexafluoride mass spectrometric study of the discharge products"; Wagner et al.; Plasma Chem. Plasma Processes; 1(2); 201-15; abstract, 1981.

Primary Examiner—Brian E. Hearn
Assistant Examiner—George Goudreau
Attorney, Agent, or Firm—Hill, Steadman & Simpson

[57] ABSTRACT

A dry etching method enabling layers of a variety of silicon based materials, such as polysilicon layer, single crystal silicon layer, metal silicide layer or a polycide film, and an aluminum based material, to be etched anisotropically without the necessity of employing depositive CFC-based gases. The etching gas is selected from a variety of gases composed mainly of sulfur halogenides, such as $S_2F_2$, $S_2Cl_2$ or $S_2Br_2$. These sulfur halogenides yield halogen radicals as the etchant in the plasma, and a variety of ions assisting the radical reaction, while yielding free sulfur S, as a result of dissociation by electrical discharge. Free sulfur then is deposited on the sample wafer etched to display the effect of sidewall protection, while the wafer is controlled to a temperature lower than room temperature. According to the present invention, since sulfur yielded in the gaseous phase is used for sidewall protection, anisotropic processing becomes possible even with a system in which, by reason of the construction of the etching mask, the carbon based polymer derived from the resist material may not be expected to by yielded. The deposited sulfur may be easily removed by sublimation by proper heating the wafer after completion of etching.

9 Claims, 2 Drawing Sheets

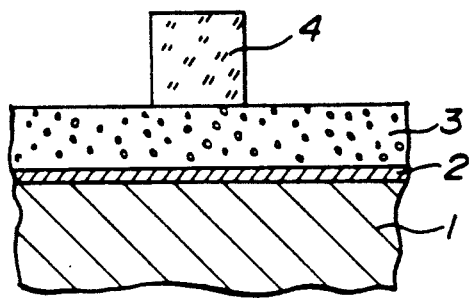
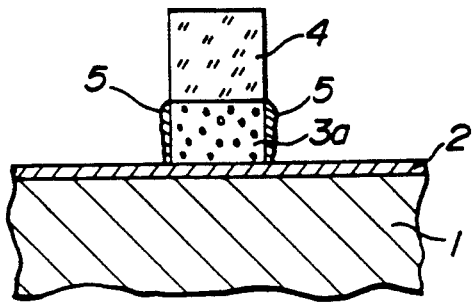
FIG.1(A)  FIG.1(B)
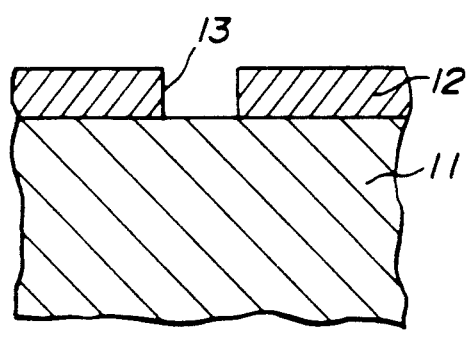
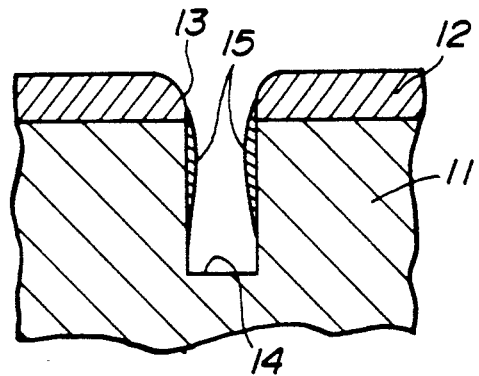
FIG.2(A)  FIG.2(B)

DRY ETCHING METHOD

BACKGROUND OF THE INVENTION

1. Field of the Invention

This invention relates to a dry etching method employed in the field of production of semiconductor devices. More particularly, it relates to a method for anisotropic etching of a layer of a material being etched without employing a CFC based gas.

2. Description of the Prior Art

As the design rule for the semiconductor devices becomes finer through the submicron level to the quarter micron level, various attempts have been made towards higher resolution and higher anisotropy in a variety of etching processes, such as etching a polysilicon layer, a refractor metal silicide layer or a polycide film for forming an electrode/interconnection layer or silicon trench etching for forming capacitors or isolation.

Heretofore, a gas system mainly consisting of a chlorofluorocarbon (mentioned as CFC hereinafter) based gas, such as CFC 113 ($C_2Cl_3F_3$), has been used for etching layers of these materials. The reason is that, since the CFC-based gas contains both fluorine and chlorine atoms in the molecule, the etching reaction may proceed effectively under both the radical mode and the ion mode, and that, since the carbonaceous compound produced from the CFC-based gas into the gaseous phase is deposited on the etching surface in the form of a carbonaceous polymer, high anisotropy may be achieved simultaneously with sidewall protection.

With a system in which the ion sputtering action can be expected, the layer of the resist material may become a carbon source for forming the carbonaceous polymer.

In contrast to the above attempts towards realizing high anisotropy by acting on the etching gas composition or etching conditions, a so-called low-temperature etching method, according to which etching is carried out while the sample wafer is cooled to a temperature not higher than 0° C., is recently attracting attention. The low temperature etching method is a technique in which, as reported for example in Proceedings of Dry Process symposium, 1988, pages 42 to 49, the sample wafer is maintained at a lower temperature for suppressing the radical reaction in the sidewall section, while the etch rate along the depth is maintained by the ion assist effect, thereby preventing shape defects, such as side etching.

However, the process employing the CFC based gases suffer from various inconveniences.

First, the CFC based gases are responsible for destruction of the ozone layer of the earth and the tendency towards the unusually high atmospheric temperature. Since manufacture and use of the CFC-based gases will be prohibited in the near future, it has become incumbent in the field of dry etching to develop a substitute etching gas and a technology of using the gas.

Second, as the design rule for the semiconductor device is expected to be finer in future, it is feared that more serious consequences may be produced as a result of contamination by a carbonaceous polymer particle derived from the CFC-based gas.

It has also been reported that the carbon contained in the CFC base gas is capable of reducing selectivity of silicon oxide to silicon. If this should occur actually, serious consequences may be produced due to the lowering of the selectivity when etching the polysilicon layer on a thin gate oxide film.

In light of the above, it has been strongly desired not to make use of the CFC based gas.

As long as low temperature etching is concerned, it is usually a process in need of cooling to about $-100°$ C. Since a cooling system capable of developing a high cooling capacity is required, the etching system is increased in size and production costs. On the other hand, the throughput of the etching process is lowered due to the prolonged wafer cooling, and prolonged wafer heating before exposure to the air for preventing dewing. Thus a demand has been raised for a process which may be carried out at a temperature closer to the room temperature.

In addition, when an etching mask is formed by the multi-layer resist process, there is also raised a problem that the sidewall protection film derived from the resist material can hardly be produced. For example, in a three-layer resist process in which a thicker lower resist layer, an intermediate silicon oxide film and a thin upper resist layer are formed step by step, the upper resist layer is patterned by photolithography, the intermediate film is patterned, with the upper resist layer as the mask, and the lower resist layer is etched, with at least the intermediate film as the mask. If the upper resist layer is removed by sputtering during etching of the lower resist layer to expose the intermediate film, there exists no resist material as the source of the carbonaceous polymer on the surface on which ions fall vertically, so that the sidewall protection film cannot be formed. Since the sidewall protection is necessary for suppressing the spontaneous reaction of chlorine and aluminum in the case of, above all, the etching process for etching the layer of the aluminum based material by the chlorine based gas, it becomes impossible with the conventional gas system to realize anisotropic etching of the layer of the aluminum material by the multi-layer resist process.

OBJECT AND SUMMARY OF THE INVENTION

It is an object of the present invention to provide a dry etching process which enables satisfactory anisotropic processing without employing a CFC based gas even with a system in which the carbon based polymer can hardly be produced from the layer of the resist material.

As a result of our eager searches towards achieving the above object, it has been found that, in etching a layer of a silicon based material or a layer of an aluminum based material, low temperature etching may be performed with the use of a gas system mainly composed of a compound containing S and Cl as constituent elements and a compound containing S and Br as constituent elements, sulfur may be effectively deposited in the higher temperature range without the necessity of cooling at the level of liquid nitrogen and the deposited sulfur may be utilized for sidewall protection to achieve satisfactory anisotropic processing.

It has also been found that, in etching a polycide film, similar effects may be produced by etching the upper refractory metal silicide layer at a lower temperature with the use of a gas system mainly composed of a compound containing S and F as the constituent elements an be etching the lower polysilicon layer at a lower temperature with the use of the aforementioned gas system.

The dry etching method according to the present invention has been proposed on the basis of the above information.

Thus the present invention provides a dry etching method comprising etching a layer of a silicon based material or a layer of an aluminum based material with the aid of an etching gas mainly composed of at least one of a compound containing S and Cl as constituent elements and a compound containing S and Br as constituent elements, with the temperature of a substrate being etched being controlled so as to be not higher than the room temperature.

Since the above etching gas does not produce highly reactive radicals, such as F*, it may be advantageously employed for realizing high anisotropy. When etching the layer of the silicon-based material, the etching gas may be used advantageously for assuring high selectivity with respect to silicon oxide. Above all, when using a Br-containing compound, no spontaneous reaction is produced between the yielded Br* radicals with larger radii and the silicon based material such as silicon or polysilicon or the refractory metal silicide layer, such as the tungsten silicide layer, and the etching reaction only proceeds as a result of ion impacts by $S^+$ or $Br^+$ ions.

With the use of such an etching gas, the layer of the material being etched is removed out of the system in the form of silicon halide or aluminum halide exhibiting a higher vapor pressure. On the other hand, sulfur is deposited in the etching region to display the effect of sidewall protection to permit anisotropic processing. For example, when forming an electrode interconnection layer by etching the polysilicon layer or the layer of the aluminum based material, undercutting or reverse taper may be prevented by sulfur deposited on the pattern sidewall. On the other hand, in silicon trench etching, bowing may be prevented by sulfur deposition.

As the compound containing S and Cl as the constituent elements, sulfur chloride, represented by $S_3Cl_2$, $S_2Cl_2$ or $SCl_2$, may be employed.

As the compound containing S and Br as the constituent elements, sulfur bromide, represented by $S_3Br_2$, $S_2Br_2$ or $SBr_2$, may be employed.

The present invention also provides a dry etching method for etching a polycide film composed of a polysilicon layer and a refractory metal silicide layer formed step by step on a sample wafer, said method comprising etching said refractory metal silicide layer using an etching gas mainly composed of a compound containing S and F as the constituent elements, with the temperature of the sample wafer being controlled so as to be not higher than room temperature, and etching said polysilicon layer using an etching gas composed of at least one of a compound containing S and Cl as constituent elements and a compound containing S and Br as constituent elements, with the temperature of said sample wafer being controlled so as to be not higher than room temperature.

Although the refractor metal silicide layer may be etched by sulfur chloride or sulfur bromide gases, as mentioned hereinabove, the vapor pressure of the chlorides or bromides of the refractory metals is generally low with these gases, so that removal is rendered difficult under lower temperature. Thus, in order to take advantage of the merit of low temperature etching, only the etching of the refractory metal silicide is performed with an F-containing gas.

As the compound containing S and F as the constituent elements, it is possible to use sulfur fluorides represented by $S_2F_2$, $SF_2$, $SF_4$ or $S_2F_{10}$.

Since the ensuing etching of the polysilicon layer is carried out by using sulfur chloride or bromide, a high substrate selectivity may be achieved even when the polycide gate electrode is formed on a thin gate oxide film. High anisotropy may also be achieved by deposition of sulfur.

Meanwhile, the sulfur deposited on the pattern sidewall may be easily removed by sublimation by raising the temperature of the sample wafer after termination of etching without the risk of contamination by a particulate material.

In accordance with the present invention, anisotropic processing may be achieved, while sidewall protection is achieved by sulfur, without using CFC based gases, at the same time that a higher substrate selectivity may be assured. Thus the proposal of the present invention is highly promising as measures for not using CFC. On the other hand, since higher anisotropy may be achieved even with a system while the carbon based product may hardly be yielded from the layer of the resist material, the layer material to be etched may be selected from a wide range of materials. Besides, while low temperature etching is performed with the present invention, production costs are not raised since no bulky and complicated cooling system is required in the system.

BRIEF DESCRIPTION OF THE DRAWINGS

FIGS. 1A and 1B are schematic cross-sectional views showing the present invention as applied to formation of a gate electrode, step by step, wherein FIG. 1A shows the process step of forming a photoresist layer and FIG. 1B the process step of etching a polysilicon layer.

FIGS. 2A and 2B are schematic cross-sectional views showing of the present invention as applied to silicon trench etching, step by step, wherein FIG. 2A shows the process step of forming a silicon oxide layer as a mask and FIG. 2B the process step of etching a single crystal silicon substrate.

FIGS. 3A and 3B are schematic cross-sectional views showing of the present invention as applied to formation of an Al interconnection layer by the three-layer resist process, step by step, wherein FIG. 3A shows the process step of forming a mask including a lower resist layer and an intermediate layer and FIG. 3B the process step of etching the layer of an Al-based material.

FIGS. 4A and 4B are schematic cross-sectional views showing of the present invention as applied to formation of a gate electrode including a polycide film, step by step, wherein FIG. 4A shows the process step of forming a photoresist layer, FIG. 4B the process step of etching a layer of a silicide of a refractory metal

DETAILED DESCRIPTION OF THE INVENTION

Figure 3A:
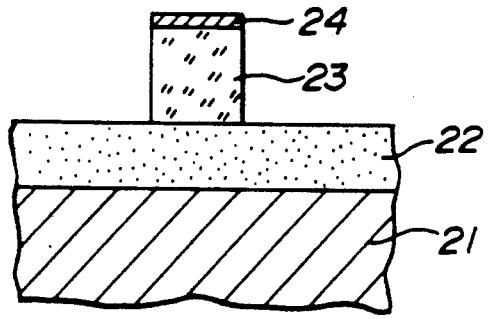

Among compounds containing S and Cl, trisulfur dichloride $S_3Cl_2$, melting at $-46°$ C., disulfur dichloride $S_2Cl_2$, melting at $-80°$ C. and sulfur dichloride $SCl_2$, melting at $-78°$ C., are thought to be most practically useful according to the present invention. Although sulfur tetrachloride $SCl_4$ is also known, this compound is a labile substance decomposed at $-30°$ C. or higher, so that it is inconvenient as an etching gas.

Among compounds containing S and Br, disulfur dibromide $S_2Br_2$, melting at $-46°$ C., is thought to be most useful. Besides, trisulfur dibromide $S_3Br_2$ and sulfur dibromide $SBr_2$ may also be employed.

The above substances are liquid at room temperature, as inferred from their melting points, and may be introduced into an etching chamber by bubbling by an inert gas. Should the cooling temperature of the sample wafer be selected to be not higher than the room temperature and higher than the above melting points, there is no risk that these compounds be solidified on contact with the wafer. According to the present invention, sulfur may be effectively deposited at thus level of the cooling temperature without any inconvenience. Rather, the operating temperature range be raised no higher than that for conventional low temperature etching.

Among compounds containing S and F, a variety of sulfur fluorides are thought to be most useful. Of these, sulfur hexafluoride $SF_6$ is a gas well-known in the field of dry etching. In addition, sulfur monofluoride $S_2F_2$, boiling at $-99°$ C., sulfur difluoride $SF_2$, gaseous at room temperature, sulfur tetrafluoride $SF_4$, melting at $-40°$ C. and sulfur pentafluoride $S_2F_{10}$, melting at $-92°$ C, may be employed.

It is noted that inert gases, $H_2$, $H_2S$, silane, $N_2$ or $O_2$ gas may optionally be added to the etching gas employed in accordance with the present invention. If the inert gases are added, it becomes possible to control the etch rate by dilution effects. If the $H_2$, $H_2S$ or silane gas is added, it becomes possible to improve anisotropy or to control the etch rate by capturing excess halogen radicals. If the $N_2$ or $O_2$ gas is added, the reaction product thereof with the silicon may be added into the constituent component of the sidewall protection film in the course of etching of the layer of the silicon-based material for improving anisotropy.

The present invention will be hereinafter explained with reference to certain examples shown in the drawings.

EXAMPLE 1

In the present example, an $S_2Cl_2$ gas is used to etch the n+ type polysilicon layer to form a gate electrode. The following explanation is made by referring to FIGS. 1A and 1B.

First referring to FIG. 1A, a polysilicon layer 3 is formed on a semiconductor substrate 1 of, for example, silicon, by the interposition of a gate oxide film 2. A photoresist layer 4 is then selectively formed by coating of a photoresist material, selective exposure to light and development for forming a wafer.

The wafer is placed on an electrode of an RF biassing ECR plasma etching apparatus and the electrode is cooled to about $-20°$ C. by a chiller through which ethanol or CFC based cooling medium manufactured and sold by Sumitomo 3M Company under the trade name of Florinat. Under these conditions, the polysilicon layer 3 is etched under conditions of an $S_2Cl_2$ gas flow rate of 50 SCCM, gas pressure of 10 mTorr, microwave power of 850 W and an RF bias power of 100 W (2 MHz). During the etching process, on and activate the surface of the polysilicon layer 3 to assist the reaction of the previously adsorbed Cl atoms and Si. Simultaneously, sulfur is deposited on the pattern sidewall to form a sidewall protection film 5. As a result, a gate electrode 3a showing a satisfactory anisotropy is produced, as shown in FIG. 1B. The deposited sulfur effectively protects the gate electrode 3a even under conditions in which Cl* become relatively excessive during over-etching without degrading the cross-sectional shape of the gate electrode 3a. Since the gas system is free of highly reactive radicals, such as F*, a high selectivity is achieved with respect to the etching base of the gate oxide film 2.

Meanwhile, the sidewall protection film 5 may be removed easily by sublimation when the wafer is heated to approximately 90° C. after completion of etching without producing particulate contamination.

EXAMPLE 2

In the present example, silicon trench etching is carried out by using the $S_2Br_2$ gas. The following explanation is made with reference to FIGS. 2A and 2B.

Referring to FIG. 2A, a silicon oxide layer 12 functioning as an etching mask is formed on a single crystal silicon substrate 11, and an opening 13 is selectively formed by patterning to form a wafer.

The wafer is placed on an electrode of an RF biasing ECR plasma etching apparatus and the electrode is cooled to about $-20°$ C. Under this condition, the single crystal substrate 11 is etched in the opening 13 under the conditions of an $S_2Br_2$ gas flow rate of 50 SCCM, gas pressure of 10 mTorr, micro-wave power of 850 W and an RF bias power of 200 W (2 MHz). During this etching process, sulfur is deposited on the sidewall section, simultaneously with reaction products, such as $SiBr_x$, to form a sidewall protection film 15 and the trench 14 exhibiting good shape anisotropy, as shown in FIG. 2B. With the progress in etching, the mask edge of the silicon oxide layer 12 in the vicinity of the opening end of the opening 13 is receded by the sputtering action and becomes rounded. When the mask edge is deformed in this manner, obliquely incident ions are usually increased by scattering in this region to produce bowing in the trench. However, such shape defects were not produced on account of the presence of the sidewall protection film 15.

EXAMPLE 3

In the present example, the etching mask is first formed by a three-layer resist process and an $S_2Cl_2$ gas is used to etch the layer of the Al based material. The following explanation is made with reference to FIGS. 3A and 3B.

First, referring to FIG. 3A, a lower resist layer 23 and an intermediate film 24 formed of a spin-on-glass (SOG) are formed as a mask on a substrate formed by an interlayer insulating film 21 and a layer of an Al-based material 22 formed on the insulating film 21. The intermediate film 24 is formed by etching, using an upper resist layer as a mask, not shown, previously patterned by photol: hography and development, while the lower resist layer 23 is formed by etching using the intermediate film 24 as the mask. With the above system, since a layer of an organic material is not exposed on the surface on which ions may fall in the vertical direction, sidewall protection by the carbon based polymer can not be expected.

Figure 3B:
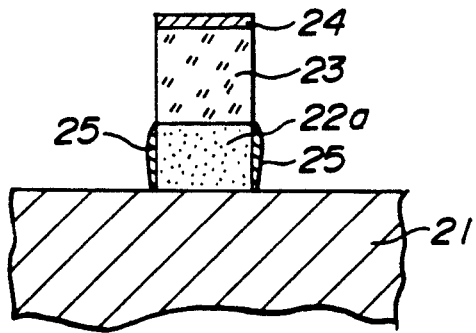

The above mentioned wafer is placed on an electrode of the RF biassing ECR plasma etching apparatus and the electrode is cooled to 0° C. In this state, the layer of the Al-based material 22 was etched under the conditions of the $S_2Cl_2$ gas flow rate of 80 SCCM, gas pressure of 10 mTorr, microwave power of 850 W and an RF bias power of 50 W (2 MHz). During the etching process, Al is removed as chloride, whereas sulfur is deposited on the etching surface to form a sidewall protection film 25. Therefore, even though side wall protection by the carbon based polymer is not achieved, the Al based interconnection layer 22a showing a good shape anisotropy is formed, as shown in FIG. 3B.

EXAMPLE 4

In the present example, a gate electrode formed by a polycide film is formed by two-step etching employing $S_2F_2$ and $S_2Cl_2$ in each step. The following explanation is made with reference to FIGS. 4A to 4C.

Figure 4A:
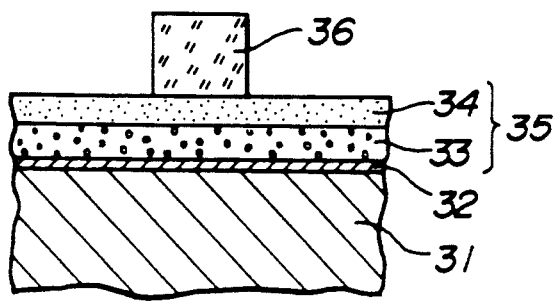

Referring to FIG. 4A, a photoresist layer 36 is selectively formed on a substrate formed by a semiconductor substrate 31 of, for example, silicon, and a polycide film 35, in turn formed by a polysilicon layer 33 and a refractory metal silicide layer 34 and deposited on the substrate 31 by the interposition of a gate oxide film 32 to form a wafer. Tungsten W is herein used as the refractory metal contained in the refractory metal silicide layer 34.

Figure 4B:
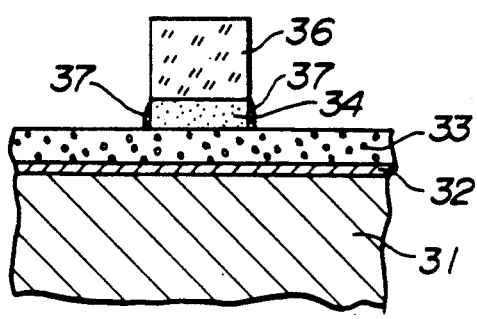

The above mentioned wafer is placed on an electrode of an RF biassing type ECR plasma etching apparatus, and the electrode is cooled to $-20°$ C. Under this condition, the refractory metal silicide layer 34 is etched under conditions of the $S_2F_2$ gas flow rate of 50 SCCM, gas pressure of 10 mTorr, microwave power of 850 W and an RF bias power of 100 W (2 MHz). During the etching process, tungsten W is removed as the fluoride at the same time that sulfur is deposited on the etching surface to form a sidewall protection film 37 to achieve a good shape anisotropy as shown in FIG. 4B.

Figure 4C:
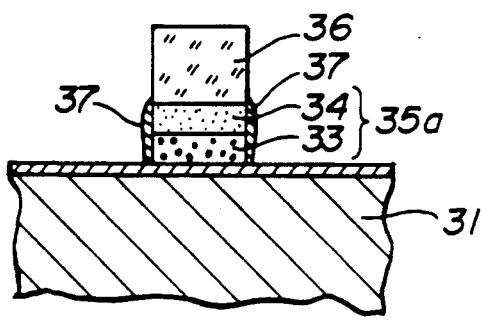
FIG. 4C shows the process step of etching a polysilicon layer.

The feed gas is then switched to $S_2Cl_2$ and etching of the polysilicon layer 33 under the similar conditions. The etching process proceeds in the same way as in example 1 to form a gate electrode 35a having good shape anisotropy as shown in FIG. 4C.

What is claimed is:

1. A dry etching method comprising etching a layer of a silicon based material or a layer of an aluminum based material formed on a sample wafer with the aid of an etching gas free of carbon based gas and comprised mainly of at least one of a compound selected from a group consisting of $S_3Cl_2$, $S_2Cl_2$ and $SCl_2$ and a compound containing S and Br as constituent elements and controlling the temperature of the sample wafer to be not higher than room temperature to deposit sulfur for side wall protection, and then heating the wafer above room temperature after completing etching to sublimate the deposited sulfur.

2. A dry etching method for etching a polycide film composed of a polysilicon layer and a refractory metal silicide layer formed step by step on a sample wafer, said method comprising
    etching said refractory metal silicide layer using an etching gas free of any carbon based gases and mainly composed of a compound containing S and F as the constituent elements, and controlling the temperature of the sample wafer to be not higher than room temperature to deposit sulfur for side wall protection, and
    etching said polysilicon layer using an etching gas free of any carbon based bases and composed of at least one of a compound containing S and Cl as constituent elements and a compound containing S and Br as constituent elements, and controlling the temperature of said sample wafer to be not higher than room ambient temperature to deposit sulfur for side wall protection.

3. The dry etching method according to claim 2 wherein said compound containing S and Cl as the constituent elements is $S_3Cl_2$, $S_2Cl_2$ or $SCl_2$.

4. The dry etching method according to claims 1 or 2 wherein said compound containing S and Br as the constituent elements is $S_3Br_2$, $S_2Br_2$ or $SBr_2$.

5. The dry etching method according to claim 2 wherein said compound containing S and F is $S_2F_2$, $SF_2$, $SF_4$, or $S_2F_{10}$.

6. The dry etching method according to claim 1 wherein said layer of the silicon based material is a polysilicon layer or a single crystal silicon layer.

7. The dry etching method according to claim 2 wherein said refractory metal silicide layer is a tungsten silicide layer, a titanium silicide layer, or a molybdenum silicide layer.

8. The dry etching method according to claims 1 or 2 wherein said etching gas contains at least one of $H_2$, $H_2S$ or silane compounds as an additional gas.

9. A dry etching method according to claim 2, which includes heating the wafer to remove the deposited sulfur.

* * * * *